United States Patent [19]
Maegawa et al.

[11] Patent Number: 5,766,989
[45] Date of Patent: Jun. 16, 1998

[54] METHOD FOR FORMING POLYCRYSTALLINE THIN FILM AND METHOD FOR FABRICATING THIN-FILM TRANSISTOR

[75] Inventors: Shigeki Maegawa; Mamoru Furuta, both of Moriguchi; Hiroshi Tsutsu, Osaka; Tetsuya Kawamura, Hirakata; Yutaka Miyata, Ikoma, all of Japan

[73] Assignee: Matsushita Electric Industrial Co., Ltd., Osaka, Japan

[21] Appl. No.: 579,140

[22] Filed: Dec. 27, 1995

[30] Foreign Application Priority Data

Dec. 27, 1994 [JP] Japan ................... 6-325177
Jan. 13, 1995 [JP] Japan ................... 7-003631

[51] Int. Cl.⁶ ........................................ H01L 21/268
[52] U.S. Cl. .................... 438/166; 438/487; 438/308; 148/DIG. 90; 117/8; 117/904
[58] Field of Search ................... 437/21, 40 TFT, 437/41 TFT, 233, 173, 174, 907, 908, 967, 973; 148/DIG. 90–DIG. 93; 117/4, 8–10, 43, 44, 904; 438/166, 308, 487, 795

[56] References Cited

U.S. PATENT DOCUMENTS

| | | | |
|---|---|---|---|
| 4,555,300 | 11/1985 | Arnold et al. | 117/43 |
| 5,264,383 | 11/1993 | Young | 437/40 TFT |
| 5,373,803 | 12/1994 | Noguchi et al. | 117/10 |
| 5,486,237 | 1/1996 | Sano et al. | 437/967 |

FOREIGN PATENT DOCUMENTS

| | | | |
|---|---|---|---|
| 0 178 447 | 4/1986 | European Pat. Off. | |
| 383230 A2 | 8/1990 | European Pat. Off. | |
| 0 612 102 A2 | 8/1994 | European Pat. Off. | |
| 61-78119 | 4/1986 | Japan | 437/174 |
| 61-260621 | 11/1986 | Japan | 437/174 |
| 63-151015 | 6/1988 | Japan | 117/43 |
| 3-50821 | 3/1991 | Japan | 437/967 |
| 3-60016 | 3/1991 | Japan | 437/967 |
| 3-60026 | 3/1991 | Japan | 437/967 |
| 3-97698 | 4/1991 | Japan | 437/967 |
| 4-132212 | 5/1992 | Japan | 437/967 |
| 5-47660 | 2/1993 | Japan | 437/967 |
| 5-47661 | 2/1993 | Japan | 437/967 |
| 5-198505 | 8/1993 | Japan | 437/967 |
| 6-77251 | 3/1994 | Japan | 437/967 |
| 6-163404 | 6/1994 | Japan | 437/967 |

OTHER PUBLICATIONS

I. Asai et al., "A Fabrication of Homogeneous Poly–Si TFT's Using Excimer Laser Annealing", Abstracts of the 1992 International Conference on Solid State Devices and Materials, pp. 55–57, 1992.

H. Kuriyama et al., "High Mobility Poly–Si TFT By A New Excimer Laser Annealing Method for Large Area Electronics", IEDM 91, pp. 563–566, 1991.

S. Noguchi et al., "Enlargement of P–Si Film Grain Size by Excimer Laser Annealing and Its Application to High–Performance P–Si TFT", Extended Abstracts of the 1991 International Conference on Solid State Devices and Materials, pp. 623–625, 1991.

Translation of JP 6–77251, Mar. 1994.

A. T. Voutsas et al., Appl. Phys. Lett. 63(11)(1993)1546 "Crystallized mixed–phase silicon films for TFTs on glass substrates", Oct. 1993.

*Primary Examiner*—Charles L. Bowers, Jr.
*Assistant Examiner*—Leon Radomsky
*Attorney, Agent, or Firm*—Ratner & Prestia

[57] ABSTRACT

A method for forming a polycrystalline semiconductor thin film according to the present invention includes the steps of: forming a semiconductor thin film partially containing microcrystals serving as crystal nuclei for polycrystallization on an insulating substrate; and polycrystallizing the semiconductor thin film by laser annealing.

12 Claims, 11 Drawing Sheets

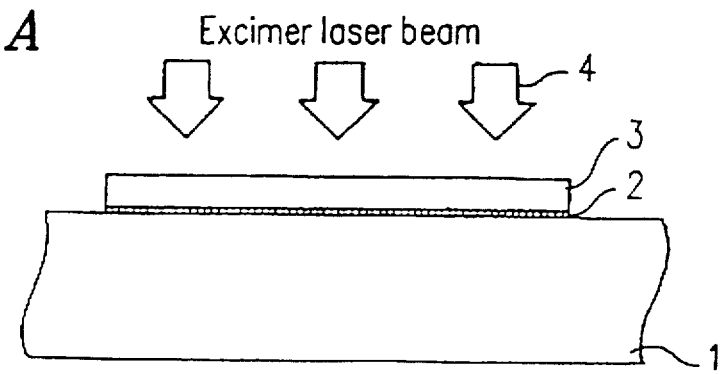
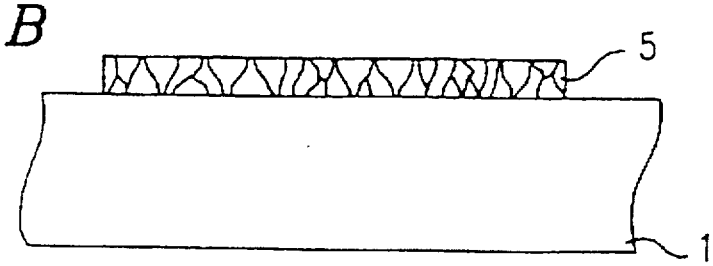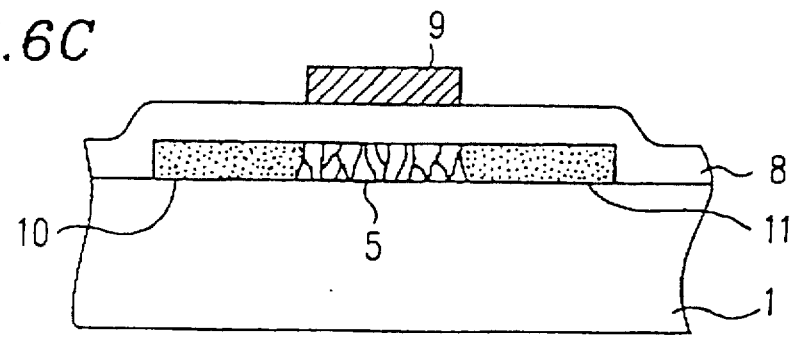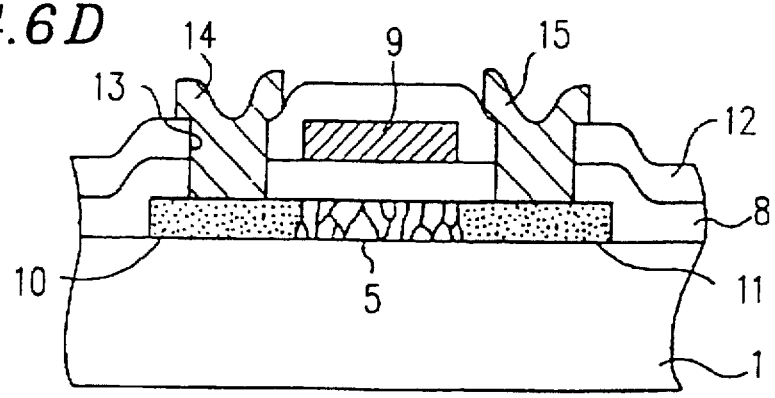

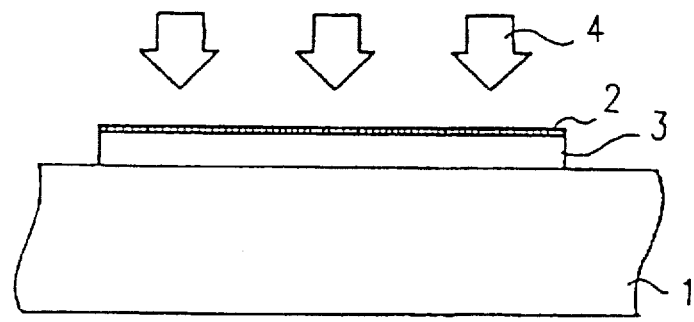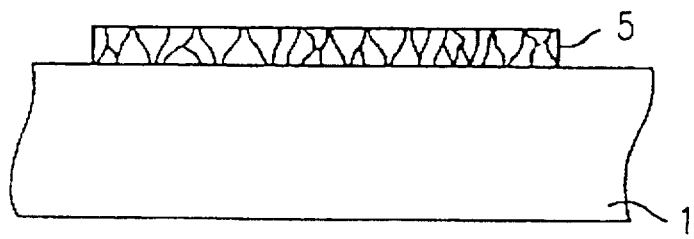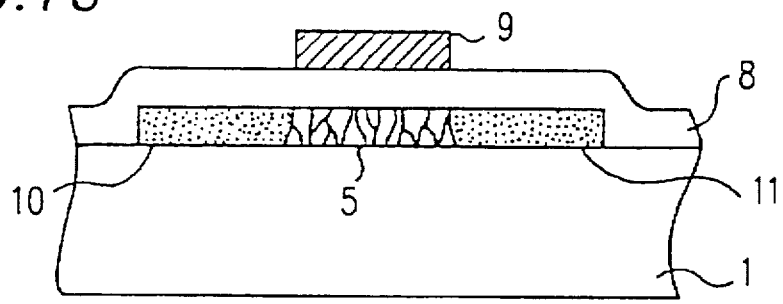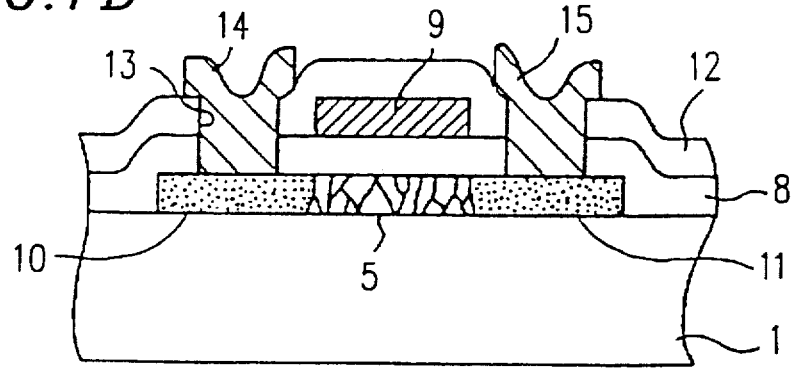

METHOD FOR FORMING POLYCRYSTALLINE THIN FILM AND METHOD FOR FABRICATING THIN-FILM TRANSISTOR

BACKGROUND OF THE INVENTION

1. Field of the Invention

The present invention relates to a method for forming a polycrystalline thin film and a thin-film semiconductor device. More specifically, the present invention relates to a method for forming a polycrystalline thin film used in a production process of a thin-film transistor for a liquid crystal display device, an image sensor, a SRAM, and the like; and a thin-film semiconductor device fabricated by using the same.

2. Description of the Related Art

In recent years, a demand for liquid crystal display devices having a large screen size, high definition, and the like, has been increasing. To satisfy such a demand, thin-film transistor (TFT) used for a liquid crystal display device is required to have higher device characteristics.

At present, an amorphous silicon TFT is used as a TFT for liquid crystal display devices. On the other hand, a polycrystalline silicon TFT has the advantages of superior device performance to that of an amorphous silicon TFT, a driving circuit can be integrally formed on a substrate of a liquid crystal display device, and the like. Accordingly, the development of polycrystalline silicon TFT's has been pursued.

In order to put a polycrystalline silicon TFT into practical use, a technology to form a high-quality polycrystalline thin film is indispensable. According to a conventional technology where a polycrystalline thin film is formed at a relatively high temperature, only a substrate made of quartz can be used. On the other hand, a low-temperature (600° C. or less), thin-film formation technology in which an inexpensive glass substrate having a low distortion point can be used, has been increasingly developed. Especially, excimer laser annealing is seen as a most promising method, because in this method a substrate is subjected to only a small amount of thermal damage, and a high-quality polycrystalline thin film can be obtained by melting and crystallizing an amorphous thin film.

Hereinafter, a conventional method for forming a polycrystalline thin film will be described. As an example, a method for forming a polycrystalline silicon thin film using excimer laser annealing will be described.

FIG. 9 is a schematic diagram showing a process of forming a polycrystalline silicon thin film by excimer laser annealing. As shown in FIG. 9, an entire surface of an amorphous silicon layer 3 is irradiated with a laser beam 4 having a cross-section shape measuring approximately 5 to 10 mm, while the laser beam 4 is moved with respect to a substrate 1. In this case, since the excimer laser is a pulsed laser, the irradiation with the excimer laser beam 4 is performed in such a manner that the irradiation beam partially overlaps the adjacent previously-irradiated region. In a polycrystalline silicon thin film 5 thus-obtained, a region 5a irradiated with the edge of the laser beam having a small energy density has a crystallinity much different from that of the other regions. Accordingly, in the case where a number of TFT arrays are formed by using such a polycrystalline silicon thin film 5, the device characteristics of each TFT periodically vary depending on the place where a TFT is formed on the substrate 1.

Hereinafter, an example of a conventional method for forming a polycrystalline thin film by using excimer laser annealing will be described with reference to FIGS. 10A to 10C. First, as shown in FIG. 10A, in a first annealing step, a laser beam 4 having an energy density of approximately 270 mJ/cm² is irradiated to an amorphous silicon layer 3 on a substrate 1. As a result, a silicon layer 2 containing crystal grains having an average diameter of approximately 50 nm is formed.

Next, as shown in FIG. 10B, in a second annealing step, a laser beam 4 having an energy density of approximately 450 mJ/cm² is irradiated to the silicon layer 2. As a result, a polycrystalline silicon film 5 having a crystal structure such as shown in FIG. 10C is formed. In the second annealing step, regions having relatively poor crystallinity (regions having crystal grains of smaller diameters as compared with the peripheral regions) is improved, so that the uniformity of the polycrystalline silicon film 5 is improved.

In this conventional example, "two-step annealing", in which a silicon layer is irradiated twice with laser beams having energy density different from each other, is performed. Hereinafter, a process of irradiating a laser beam to regions in which a polycrystalline silicon thin film should be formed while moving the laser beam with respect to a substrate, is counted as one step.

A method for forming a polycrystalline thin film by two-step annealing is reported, for example, in Extended Abstracts of the 1992 International Conference on Solid State Devices and Materials B-1-4, 1992, on page 55 to 57.

Hereinafter, another example of a conventional method for forming a polycrystalline thin film by using excimer laser annealing will be described with reference to FIGS. 11A and 11B.

In this example, as shown in FIG. 11A, annealing is performed for an amorphous silicon layer 3 on a substrate 1 heated at approximately 400° C. by using an excimer laser having energy density of approximately 300 mJ/cm². Under a condition in which a substrate is heated, the solidification rate is slowed down, so that a growth of crystal grains are promoted, as compared with a non-heated condition. Moreover, as the temperature of the thin film is increased by heating the substrate, the temperature of the regions thereof, which will not reach the melting point and will not become molten by annealing unless the substrate is heated, is increased to a temperature high enough to reach the melting point, so that such regions melt. Accordingly, since the entire regions irradiated with a laser beam are subject to a process of melting and crystallization, a uniformity of the polycrystalline silicon film is improved, as shown in FIG. 11B.

There is a method by which an entire irradiated region is molten by increasing energy density of a laser beam under a non-heated condition. However, in such a method, the frequency with which ablation of thin film occurs becomes high, so that this method cannot be used substantially.

A method for forming a polycrystalline thin film by using excimer laser annealing under a condition of heating a substrate is reported, for example, in IEDM Tech. Digest, 1991, on pages 563 to 566.

If a TFT is formed by using a thus-obtained polycrystalline silicon thin film, variations of mobility of TFT across the substrate can be suppressed within ±10%. Such a method for forming a TFT is reported, for example, in Extended Abstracts of the 1991 International Conference on Solid State Devices and Materials, 1991, on pages 623 to 625.

However, the conventional methods have problems such as described below:

In employing a two-step annealing method; in a first annealing step, a crystal region having crystal grains with an average diameter smaller as compared with the peripheral region having an average diameter of approximately 50 nm, is formed in a region irradiated with the edge of the laser beam 4, especially in a region irradiated with the portion of the beam having an energy density near the threshold value of crystallization. Therefore, in the second annealing step, or in the case where the laser beam is irradiated while overlapping the adjacent previously-irradiated region, only a slight expansion of the diameter of crystal grains or a slight reduction in crystal deficiency can be achieved. Accordingly, such regions have crystal characteristics much different from those of polycrystalline silicon regions obtained by melting and crystallizing an amorphous silicon.

Moreover, when laser annealing is performed while heating a substrate, a melt crystallization can be achieved in crystal regions having crystal grains with an average diameter smaller than that of the peripheral region. However, the energy required for crystallization is different between the case of changing an amorphous state into a polycrystalline state and the case of changing the state in which crystal grains have a small average diameter into a polycrystalline state. Therefore, a different crystallinity is obtained from respective cases.

As described above, according to the conventional methods, the crystallinity of the polycrystalline silicon thin film is not uniform across the substrate. Accordingly, in the case where a TFT array is formed by using such a polycrystalline silicon thin film, there is a problem that variations of the device characteristics of the TFT across the substrate cannot be reduced to a sufficient level. Especially, in the case where a TFT array is formed in a display portion of a liquid crystal display device, there is a disadvantage that the lattice-shaped display inconsistencies appear on a screen due to the existence of the TFT having a relatively low mobility, resulting in deterioration of display quality.

SUMMARY OF THE INVENTION

The method for forming a polycrystalline semiconductor thin film of this invention includes the steps of:

forming a semiconductor thin film partially containing microcrystals serving as crystal nuclei for polycrystallization on an insulating substrate; and polycrystallizing the semiconductor thin film by laser annealing.

In one embodiment of the invention, the semiconductor thin film prior to being subjected to the polycrystallization process contains a microcrystalline semiconductor layer containing the microcrystals, and an amorphous semiconductor layer being in contact with the microcrystalline semiconductor layer.

In another embodiment of the invention, the semiconductor thin film prior to being subjected to the polycrystallization process contains a microcrystalline semiconductor layer containing the microcrystals, and the amorphous semiconductor layer deposited on the microcrystalline semiconductor layer.

In still another embodiment of the invention, the semiconductor thin film prior to being subjected to the polycrystallization process contains an amorphous semiconductor layer, and a microcrystalline semiconductor layer deposited on the amorphous semiconductor layer and containing the microcrystals.

In still another embodiment of the invention, the semiconductor thin film further contains another amorphous semiconductor layer deposited on the microcrystalline semiconductor layer.

In still another embodiment of the invention, the microcrystalline semiconductor layer is formed by using a CVD method.

In still another embodiment of the invention, the laser annealing is conducted by using an excimer laser.

In still another embodiment of the invention, the laser annealing is conducted while the insulating substrate is maintained at a temperature in a range of approximately 200° to 600° C.

In still another embodiment of the invention, the semiconductor thin film is formed of a semiconductor material containing silicon or germanium as a main component.

In still another embodiment of the invention, the average diameter of crystal grains of microcrystals contained in the microcrystalline semiconductor layer is 20 nm or less.

In still another embodiment, the process of forming the semiconductor thin film includes the steps of:

forming an amorphous semiconductor layer; and annealing the amorphous semiconductor layer by a laser beam having an energy density near a threshold value of crystallization, thereby forming the microcrystal nuclei.

In still another embodiment of the invention, the process of forming the microcrystalline semiconductor layer includes the steps of:

forming an amorphous semiconductor layer; and annealing the amorphous semiconductor layer by a laser beam having an energy density near a threshold value of crystallization, thereby changing the amorphous semiconductor layer into the microcrystalline semiconductor layer.

A method for fabricating a thin-film transistor includes the steps of:

forming a semiconductor thin film containing microcrystals serving as crystal nuclei for polycrystallization on an insulating substrate; and polycrystallizing the semiconductor thin film by laser annealing, thereby forming a polycrystalline semiconductor thin film; and forming a source region, a drain region, and a channel region in the polycrystalline semiconductor thin film.

In one embodiment of the invention, the semiconductor thin film prior to being subjected to the polycrystallization process contains a microcrystalline semiconductor layer containing the microcrystals, and an amorphous semiconductor layer being in contact with the microcrystalline semiconductor layer.

In another embodiment of the invention, the average diameter of crystal grains of microcrystals contained in the microcrystalline semiconductor layer is 20 nm or less.

Thus, the invention described herein makes possible the advantages of (1) providing a method for forming a polycrystalline thin film having a uniformed crystallinity across the substrate; and (2) providing a method for fabricating a thin-film transistor having only small variations of characteristics across the substrate.

These and other advantages of the present invention will become apparent to those skilled in the art upon reading and understanding the following detailed description with reference to the accompanying figures.

BRIEF DESCRIPTION OF THE DRAWINGS

FIGS. 6A to 6D are sectional views showing an example of a method for fabricating a thin-film transistor according to the present invention.

FIGS. 7A to 7D are sectional views showing another example of a method for forming a thin-film transistor according to the present invention.

DESCRIPTION OF THE PREFERRED EMBODIMENTS

Figure 1A:
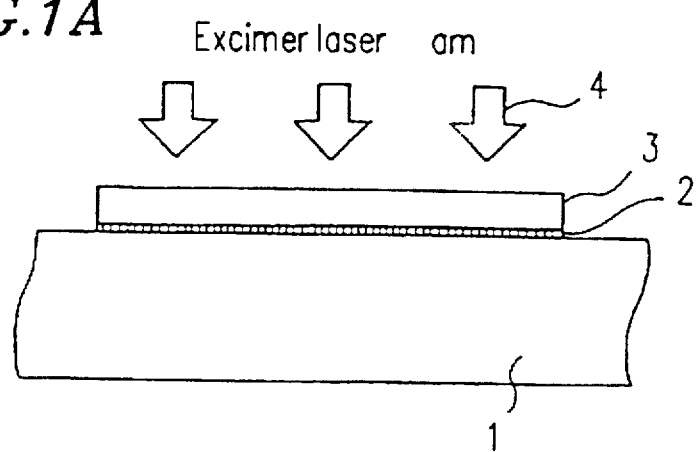
FIGS. 1A and 1B are sectional views showing a method for forming a polycrystalline thin film according to a first example of the present invention.

Hereinafter, a method for forming a polycrystalline thin film according to the present invention will be described with reference to the accompanied drawings.

In the following examples, annealing is performed for an amorphous silicon layer by using an excimer laser beam, whereby a polycrystalline silicon thin film is formed. In the specification of the present application, a semiconductor layer (thin film) containing crystal grains having average diameter of 20 nm or less is referred to as "a microcrystalline semiconductor layer (thin film)". It is considered that in a microcrystalline semiconductor layer, microcrystals are dispersed in amorphous portions. On the other hand, a semiconductor layer having crystal grains with an average diameter larger than 20 nm is referred to as "a polycrystalline semiconductor layer (thin film)". Generally, in a polycrystalline semiconductor layer, crystal grains are in contact with each other, whereby the grain boundaries are formed.

EXAMPLE 1

Hereinafter, a first example of a method for forming a polycrystalline thin film according to the present invention will be described with reference to FIGS. 1A and 1B.

A microcrystalline silicon layer 2 having a thickness of 5 nm is deposited on a glass substrate 1 (trade name: 7059, fabricated by Corning Inc.), on which an $SiO_2$ film (not shown) is attached as a buffer layer for preventing the impurities from diffusing from the glass, by a plasma CVD method and using silane ($SiH_4$) and hydrogen ($H_2$) as a material gas. In this case, the deposition is conducted under the condition that the value of $SiH_4/(SiH_4+H_2)$ is in the range of 0.01 to 0.5%, the pressure is in the range of 0.4 to 2 Torr, the power density is in the range of 0.1 to 0.5 W/cm², and the temperature of the substrate is in the range of 150 to 300° C. From the viewpoint of throughput, it is preferred that the thickness of the microcrystalline silicon layer 2 is in the range of approximately 1 to 10 nm. By selecting the above-mentioned condition, the silicon layer 2 containing the microcrystals can be obtained. However, under the condition that the value of $SiH_4/(SiH_4+H_2)$ is 5% or more, the microcrystalline silicon layer 2 cannot be obtained, but a normal amorphous silicon layer can be obtained. Moreover, the microcrystalline silicon thin film 2 can be obtained by using a mixed gas of $SiH_4$ and $SiF_4$, instead of the above-mentioned gas. The microcrystalline silicon layer 2 can be obtained by using another method in which after the amorphous silicon layer is deposited, the amorphous silicon layer is annealed by a laser beam having an energy density smaller than the threshold value of the crystallization.

Next, by a plasma CVD method using silane as a material gas, an amorphous silicon layer 3 having a thickness of 50 nm is deposited on the microcrystalline silicon layer 2. It is preferred that the thickness of the amorphous silicon layer 3 is in the range of 30 to 200 nm. In the case where the amorphous silicon layer 3 has the thickness larger than 200 nm, there is the possibility that the amorphous silicon layer 3 does not melt all the way through to the bottom thereof by the laser beam annealing.

Next, by using a well-known photolithography and etching technique, the amorphous silicon layer 3 and the microcrystalline silicon layer 2 are processed, so that an island-shaped structure is formed. Although a single island-shaped structure is shown in FIG. 1A, in fact, a plurality of island-shaped structures are arranged on one substrate. Each island-shaped structure has a size of, for example, 20 μm×20 μm.

Figure 1B:
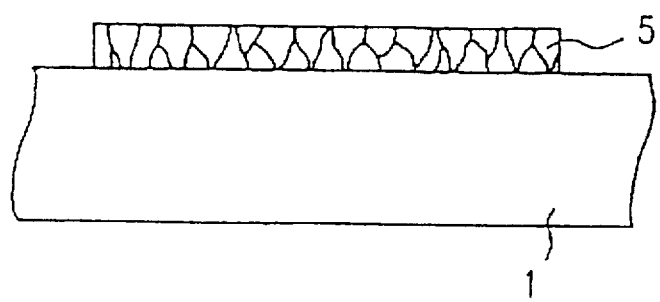

Next, as schematically shown in FIG. 1A, a laser beam 4 is irradiated to the structure. The irradiation is performed by a step-and-repeat method. In this example, the laser beam irradiation is performed by using an excimer laser beam having a wavelength of 308 nm, a pulse width of 45 nm, and an energy density of 200 to 500 mJ/cm².

In the amorphous silicon layer 3 to which the laser beam 4 is irradiated, crystal grains grow by using microcrystals in the microcrystalline silicon layer 2 as a seed. As a result, as schematically shown in FIG. 1B, a polycrystalline silicon film 5 in which crystal grains having a uniform size (grain diameter: approximately in the range of 200 to 300 nm) are distributed over the entire surface of the substrate 1 can be obtained.

EXAMPLE 2

Hereinafter, a second example of a method for forming a polycrystalline thin film according to the present invention will be described with reference to FIGS. 2A and 2B.

A microcrystalline silicon layer 2 having a thickness of 80 nm is deposited on a glass substrate 1 (trade name: 7059, fabricated by Corning Inc.), on which an $SiO_2$ film (not shown) is attached as a buffer layer for preventing the impurities from diffusing from the glass, by a plasma CVD method and using silane ($SiH_4$) as a material gas. The temperature of the substrate 1 during deposition is set, for example, to 450° C. For the same reason as described previously, it is preferred that the thickness of the amorphous silicon layer 3 is in the range of 30 to 200 nm.

Next, the temperature of the substrate 1 is increased to 480° C., and then, by a plasma CVD method using silane as a material gas, a microcrystalline silicon layer 2 having a thickness of 5 nm is deposited on the amorphous silicon layer 3. It is preferred that the thickness of the microcrystalline silicon layer 2 is in the range of 1 to 10 nm.

Next, by using a well-known photolithography and etching technique, the amorphous silicon layer 3 and the microcrystalline silicon layer 2 are processed, so that an island-shaped structure is formed. Although a single island-shaped structure is shown in FIG. 2A, in fact, a plurality of island-shaped structures are arranged on one substrate. Each island-shaped structure is in the size of, for example, 40 μm×40 μm.

Figure 2A:
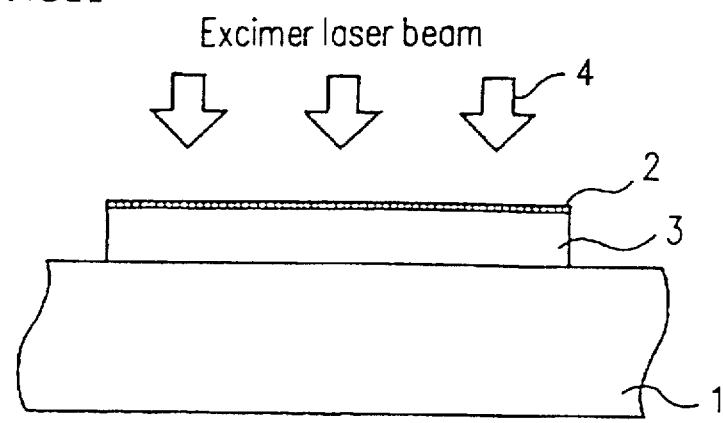
FIGS. 2A and 2B are sectional views showing a method for forming a polycrystalline thin film according to a second example of the present invention.
Figure 2B:
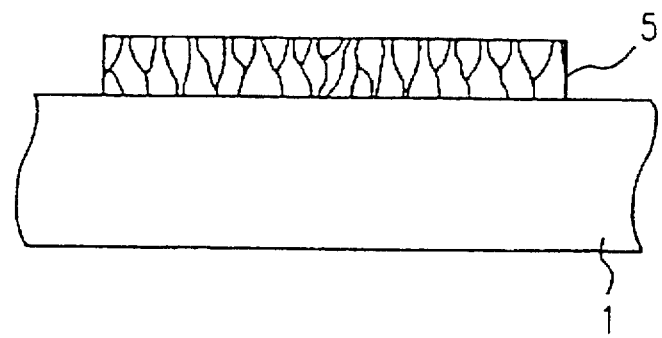

Next, as schematically shown in FIG. 2A, a laser beam 4 is irradiated to the structure. The irradiation is performed under the same condition as that described in Example 1.

In the amorphous silicon layer 3 to which the laser beam 4 is irradiated, crystal grains grow by using microcrystals in the microcrystalline silicon layer 2 as a seed. As a result, as schematically shown in FIG. 2B, a polycrystalline silicon film 5 in which crystal grains having a uniform size (grain diameter: approximately in the range of 200 to 300 nm) are distributed over the entire surface of the substrate 1 can be obtained.

The amorphous silicon layer 3 in this example has a thickness larger than that of the amorphous silicon layer 3 described in Example 1 by 30 nm. Generally, if the amorphous silicon layer 3 is thick, there is a large possibility that the crystal growth by the laser annealing starts from the surface of the amorphous silicon layer 3. Accordingly, in this example, the microcrystalline silicon layer 2 which serves as a seed are arranged so as to be in contact with the surface of the amorphous silicon layer 3.

EXAMPLE 3

Hereinafter, a third example of a method for forming a polycrystalline thin film according to the present invention will be described with reference to FIGS. 3A and 3B.

An amorphous silicon layer 3 having a thickness of 20 nm is deposited on a glass substrate 1 (trade name: 7059, fabricated by Corning Inc.), on which an $SiO_2$ film (not shown) is attached as a buffer layer for preventing the impurities from diffusing from the glass, by a plasma CVD method and using silane ($SiH_4$) as a material gas. The temperature of the substrate 1 during deposition is set, for example, to 300° C. It is preferred that the thickness of the amorphous silicon layer 3 is in the range of 30 to 200 nm.

Next, by a plasma CVD method using silane ($SiH_4$) and silicon fluoride ($SiF_4$) as a material gas, a microcrystalline silicon layer 2 having a thickness of 5 nm is deposited. The temperature of the substrate 1 is set to 300° C. it is preferred that a thickness of the microcrystalline silicon layer 2 is in the range of 1 to 10 nm.

The temperature of the substrate 1 is decreased to 270° C., and then, by a plasma CVD method using silane as a material gas, an amorphous silicon layer 6 having a thickness of 20 nm is deposited on the microcrystalline silicon layer 2.

Next, by using a well-known photolithography and etching technique, the amorphous silicon layer 3 and the microcrystalline silicon layer 2 are processed, so that an island-shaped structure is formed. Although a single island-shaped structure is shown in FIG. 3A, in fact, a plurality of island-shaped structures are arranged on one substrate. Each island-shaped structure has a size of, for example, 20 μm×20 μm.

Figure 3A:
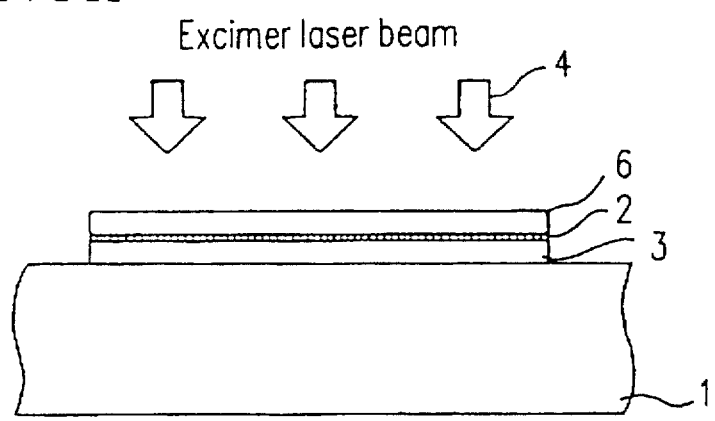
FIGS. 3A and 3B are sectional views showing a method for forming a polycrystalline thin film according to a third example of the present invention.
Figure 3B:
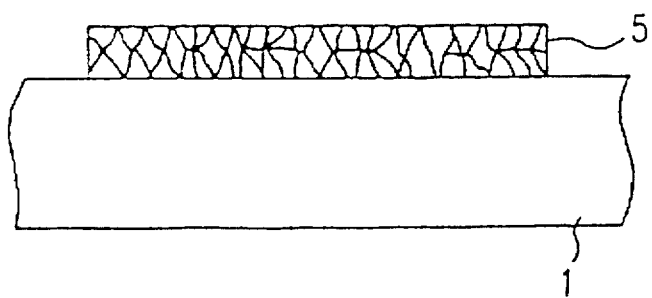

Next, as schematically shown in FIG. 3A, a laser beam 4 is irradiated to the structure. The irradiation is performed under the same condition as that described in Example 1.

In the amorphous silicon layers 3 and 6 to which the laser beam 4 is irradiated, crystal grains grow upwards and downwards by using microcrystals in the microcrystalline silicon layer 2 as a seed. As a result, as schematically shown in FIG. 3B, a polycrystalline silicon film 5 in which crystal grains having a uniform size (grain diameter: approximately in the range of 200 to 300 nm) are distributed over the entire surface of the substrate 1 can be obtained.

Although the thickness of the amorphous silicon layer 3 is made equal to that of the amorphous silicon layer 6 in this example, the thickness of the amorphous silicon layer 3 can be different from that of the amorphous silicon layer 6.

In examples 1 to 3, the microcrystalline silicon layer 2 and the amorphous silicon layer 3 are patterned in an island shape, and then laser annealing is performed thereto for polycrystallization. However, it is also possible that the microcrystalline silicon layer 2 and the amorphous silicon layer 3 are subjected to the laser annealing first, and then are patterned to be in an island shape. When the microcrystalline silicon layer 2 and the amorphous silicon layer 3 are patterned to be in an island shape, and then a laser annealing is performed thereto, there is a case where a crystallinity is deteriorated in an edge portion of the island-shaped structure due to the influence of edge cooling. Such an edge portion having a deteriorated crystallinity (for example, an edge portion having a width of approximately 1 μm) can be selectively removed by etching.

EXAMPLE 4

Figure 4A:
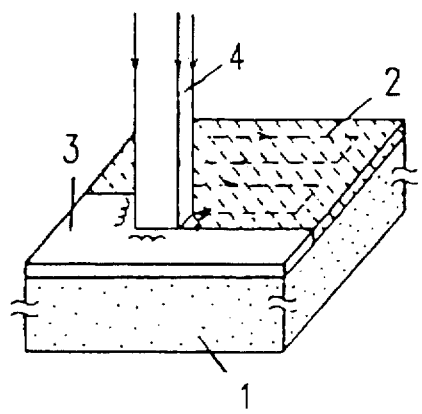
FIG. 4A is a diagram showing a first annealing step of a method for forming a polycrystalline thin film according to a forth example of the present invention.

Hereinafter, a forth example of a method for forming a polycrystalline thin film according to the present invention will be described with reference to FIGS. 4A through 4C. In this example, a polycrystalline silicon thin film is formed by using annealing conducted by excimer laser (an XeC1 laser, a wavelength: 308 nm).

First, an amorphous silicon layer 3 is deposited on a substrate 1. Then, as shown in FIG. 4A, a first annealing (a process of microcrystallization) is conducted. The annealing is conducted by irradiating an excimer laser beam 4 to an amorphous silicon layer 3. An energy density of the excimer laser beam 4 is adjusted so that the center portion of the cross-section of the beam has the energy density near the threshold value of crystallization. By irradiating a laser beam having the energy density near the threshold value of crystallization, a plurality of microcrystals are formed in the amorphous silicon layer 3. The edge portion of the laser beam 4 has an energy density smaller than the threshold value of crystallization. For this reason, in the amorphous silicon layer 3 irradiated with the laser beam 4, the region irradiated with the edge portion of the laser beam 4 which is not microcrystallized remains amorphous, and is kept in an initial state. The irradiation is sequentially repeated in such a manner that the pulsedlaser beam 4 is irradiated to the region by partially overlapping the adjacent previously-irradiated region. As a result, a microcrystalline silicon layer 2 is formed.

Figure 4B:
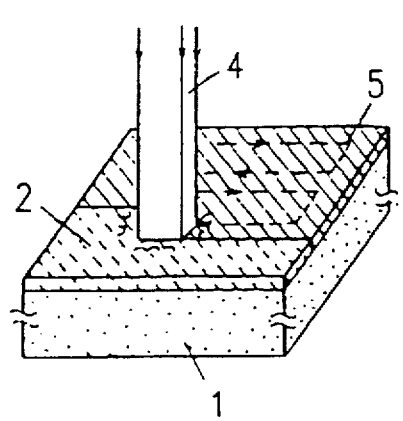
FIG. 4B is a diagram showing a second annealing step of a method for forming a polycrystalline thin film according to a first example of the present invention.
Figure 4C:
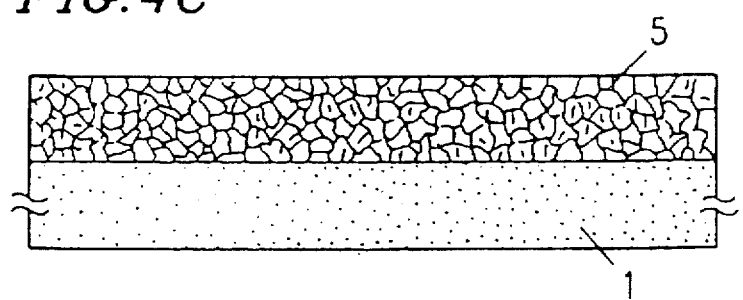
FIG. 4C is a partial sectional view showing a formed polycrystalline silicon thin film.

Next, as shown in FIG. 4B, a second annealing is conducted. The annealing is conducted by using an excimer laser beam having the cross section in which the center portion thereof has the energy density of approximately 400 mJ/cm$^2$. By the second annealing, a polycrystalline silicon thin film 5 is formed from the microcrystalline silicon layer 2. In this case, in the microcrystalline silicon layer 2, the region thereof irradiated with a portion of the excimer laser beam having the energy density near the threshold value of crystallization or less does not change and is kept in a microcrystalline state. The regions in the microcrystalline silicon layer 2 irradiated with the portion of the excimer laser beam 4 having the energy density larger than the threshold value of the crystallization grow into polycrystals, while the microcrystals formed in the first annealing are kept as they are.

The reason for the above is as follows: as the steps of crystallization proceeds from the amorphous state, microcrystalline state, and to polycrystalline state, the melting point tends to become higher and the absorption coefficient of laser beam tends to become lower. Accordingly, the microcrystals require an additional energy for melting and changing its crystallinity as compared with the amorphous state. As a result, in both of the first annealing and the second annealing, no regions having crystallinity different from the peripheral regions are formed, and the uniformity of the crystallinity is improved.

EXAMPLE 5

Figure 5A:
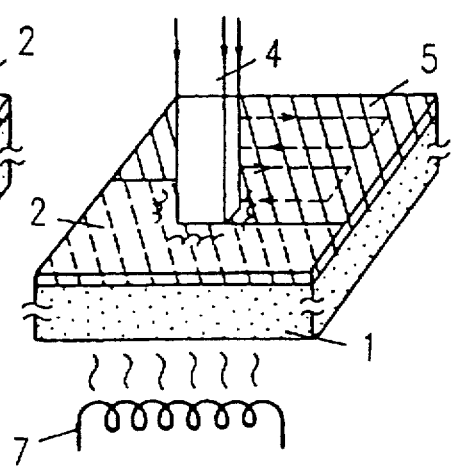
FIG. 5A is a diagram showing the first annealing step of a method for forming a polycrystalline thin film according to the fifth example of the present invention.

Hereinafter, a fifth example of a method for forming a polycrystalline thin film according to the present invention will be described with reference to FIGS. 5A through 5C. In this example, a polycrystalline silicon thin film is formed by annealing using an excimer laser (an XeCl laser, a wavelength 308 nm).

First, an amorphous silicon layer 3 is deposited on a substrate 1. Then, as shown in FIG. 5A, a first annealing (a process of microcrystallization) is conducted. As shown in FIG. 5A, in this annealing, the irradiation of the pulsed laser beam 4 is sequentially repeated in such a manner that after a region is irradiated, the next adjacent unirradiated region is irradiated while partially overlapping the laser beam with the adjacent previously-irradiated region. Since the center portion of the cross-section of the laser beam has an energy density of approximately 160 mJ/cm$^2$ which is close to the threshold value of crystallization, a microcrystalline silicon layer 2 containing microcrystals is formed by the first annealing.

Figure 5B:
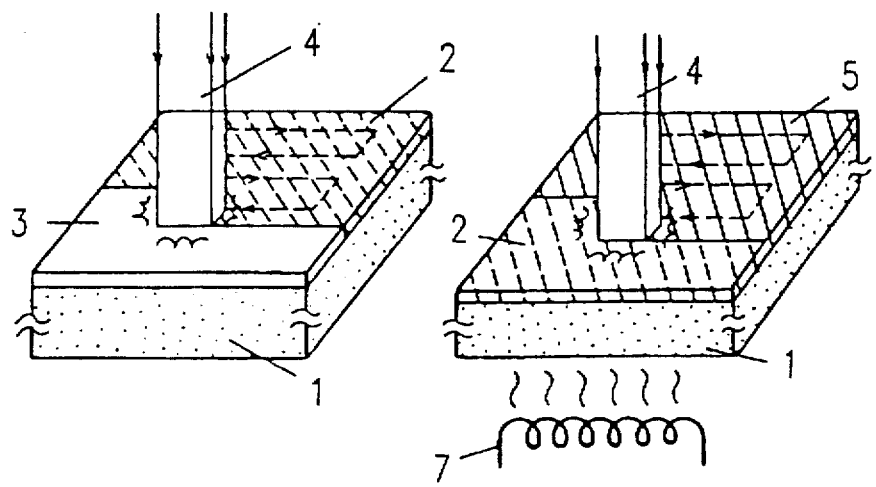
FIG. 5B is a diagram showing the second annealing step of a method for forming a polycrystalline thin film according to the first example of the present invention.
Figure 5C:
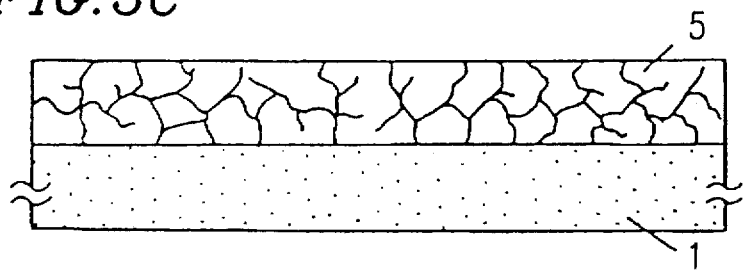
FIG. 5C is a partial sectional view showing a formed polycrystalline silicon thin film.

Next, as shown in FIG. 5B, a second annealing is conducted by using an excimer laser beam having a cross section in which the center portion thereof has the energy density of approximately 400 mJ/cm$^2$. In this annealing, while a temperature of a substrate 1 is maintained at approximately 200° to 600° C. using a heating means 7 such as a heater, etc., an excimer laser beam 4 is irradiated to an amorphous silicon layer 3. By the second annealing, a polycrystalline silicon thin film 5 is formed from the microcrystalline silicon layer 2. In the second annealing, the difference in temperature between the microcrystalline silicon layer 2 and the substrate 1 is small as compared with the case where the substrate is not heated, so that the thermal flow from the microcrystalline silicon layer 2 to the substrate 1 decreases. As a result, the solidification (cooling) rate is reduced, so that the diameter of crystal grains becomes larger as compared with the case where the substrate is not heated. Moreover, the crystal distortion generated during solidification is reduced. As a result, a high-quality polycrystalline silicon thin film with high uniformity across the substrate is formed.

In Examples 1 to 5, silicon is used as a material of a thin film to be polycrystallized. However, in the present invention, other semiconductor materials such as germanium, silicon/germanium alloy, and the like, can be used. Moreover, in Examples 1 to 5, a plasma CVD method and a thermal CVD method are used as a method for depositing an amorphous thin film. However, other methods such as an ECR-CVD method, a remote CVD method, a sputtering method, and the like, can be also employed for depositing a thin film.

Moreover, instead of a glass substrate 1 (trade name: 7059, fabricated by Corning Inc.), other insulating substrates such as other kinds of glass substrate, a quartz substrate, a sapphire substrate, and the like, can be used. Moreover, although an excimer laser is used as a laser, the same effect can be obtained by using other lasers such as a YAG laser.

EXAMPLE 6

Hereinafter, an example of a method for fabricating a TFT according to the present invention will be described with reference to FIGS. 6A through 6D.

A microcrystal silicon layer 2 having a thickness of 5 nm is deposited on a glass substrate 1 (trade name: 7059, fabricated by Corning Inc.), on which an SiO$_2$ film (not shown) is attached as a buffer layer for preventing the impurities from diffusing from the glass, by a plasma CVD method by using silane (SiH$_4$) and hydrogen (H$_2$) as a material gas. It is preferred that the thickness of the microcrystalline silicon layer 2 is in the range of 1 to 10 nm.

Next, by a plasma CVD method using silane as a material gas, an amorphous silicon layer 3 having a thickness of 50 nm is deposited on the microcrystalline silicon layer 2. It is preferred that the thickness of the amorphous silicon layer 3 is in the range of 30 to 200 nm.

Next, by using a well-known photolithography and etching technique, the amorphous silicon layer 3 and the microcrystalline silicon layer 2 are processed, so that an island-shaped structure is formed. Although a single island-shaped structure is shown in FIG. 6A, in fact, a plurality of island-shaped structures are arranged on one substrate. Each island-shaped structure is in the size of, for example, 20 μm×20μm.

Next, as schematically shown in FIG. 6A, a laser beam 4 is irradiated to the structure. The irradiation is performed by a step-and-repeat method. In this example, the laser beam irradiation is performed by using an excimer laser beam having a wavelength of 308 nm, a pulse width of 45 ns, and an energy density of 200 to 500 mJ/cm$^2$.

In the amorphous silicon layer 3 to which the laser beam 4 is irradiated, crystal grains grow by using microcrystals in the microcrystalline silicon layer 2 as a seed. As a result, as schematically shown in FIG. 6B, a polycrystalline silicon film 5 in which crystal grains having a uniform size (grain diameter: approximately in the range of 200 to 300 nm) are distributed over the entire surface of the substrate 1 can be obtained.

Next, as shown in FIG. 6C, a gate insulating film 8 made of SiO$_2$ is deposited over the entire surface of a substrate 1 by an AP-CVD method. After a chromium (Cr) film is deposited on the gate insulating film 8 by a sputtering method, the chromium film is patterned by photolithography and etching technique, so that a gate electrode 9 is formed.

A polycrystalline silicon film 5 is doped with impurity ions by using the gate electrode 9 as a mask, whereby a source region 10 and a drain region 11 are formed in self-alignment with the gate electrode 9, as shown in FIG. 6D. Implantation of impurity ions is conducted, for example, by using an ion doping method in which mass separation is not performed. Alternatively, a bucket type ion doping method can be employed. To activate the impurities, it is necessary to perform a heat treatment at a temperature of 300° to 600° C. in any step after the implantation is finished.

Next, after depositing an interlevel insulating film 12 made of SiO$_2$ by an AP-CVD method, contact holes 13 are formed in the interlevel insulating film 12 so as to reach the source region 10 and the drain region 11. After an aluminum (Al) film is deposited on the interlevel insulating film 12 by a sputtering method, the aluminum film is patterned by photolithography and etching technique, so that a source electrode 14 and a drain electrode 15 are formed. The source electrode 14 and the drain electrode 15 are connected to the source region 10 and the drain region 11 via the contact hole 13, respectively.

As a result, a TFT having a structure such as shown in FIG. 6D is obtained. Then, preferably, the TFT is annealed in an atmosphere of hydrogen, whereby dangling bonds that exist in the grain boundaries in the polycrystalline silicon film 5 are terminated with hydrogen. In this case, variations of field effect mobility of the TFT across the substrate are suppressed to 4% or less.

EXAMPLE 7

Hereinafter, another example of another method for fabricating a TFT according to the present invention will be described with reference to FIGS. 7A through 7D.

An amorphous silicon layer 3 having a thickness of 80 nm is deposited on a glass substrate 1 (trade name: 7059, fabricated by Corning Inc.), on which an SiO$_2$ film (not shown) is attached as a buffer layer for preventing the impurities from diffusing from the glass, by a plasma CVD method and using silane (SiH$_4$) as a material gas. The temperature of the substrate 1 during deposition is set, for example, to 450° C. It is preferred that the thickness of the amorphous silicon layer 3 is in the range of 30 to 200 nm.

Next, the temperature of the substrate 1 is increased to 480° C., and then, by a plasma CVD method using silane as a material gas, a microcrystalline silicon layer 2 having a thickness of 5 nm is deposited on the amorphous silicon layer 3. It is preferred that the thickness of the microcrystalline silicon layer 2 is in the range of 1 to 10 nm.

Next, by using a well-known photolithography and etching technique, the amorphous silicon layer 3 and the microcrystalline silicon layer 2 are processed, so that an island-shaped structure is formed. Although a single island-shaped structure is shown in FIG. 7A, in fact, a plurality of island-shaped structures are arranged on one substrate. Each island-shaped structure is in the size of, for example, 20 µm×20 µm.

Next, as schematically shown in FIG. 7A, a laser beam 4 is irradiated to the structure. The irradiation is performed under the same condition as that described in Example 1.

In the amorphous silicon layer 3 to which the laser beam 4 is irradiated, crystal grains grow by using microcrystals in the microcrystalline silicon layer 2 as a seed. As a result, as schematically shown in FIG. 7B, a polycrystalline silicon film 5 in which crystal grains having a uniform size (grain diameter: approximately in the range of 200 to 300 nm) are distributed over the entire surface of the substrate 1 can be obtained.

Next, as shown in FIG. 7C, a gate insulating film 8 made of SiO$_2$ is deposited over the entire surface of a substrate 1 by an AP-CVD method. After a chromium (Cr) film is deposited on the gate insulating film 8 by a sputtering method, the chromium film is patterned by photolithography and etching technique, so that a gate electrode 9 is formed.

A polycrystalline silicon film 5 is doped with impurity ions by using the gate electrode 9 as a mask, whereby a source region 10 and a drain region 11 are formed in the position self-aligned to the gate electrode 9, as shown in FIG. 7D.

Next, after depositing an interlevel insulating film 12 made of SiO$_2$ by an AP-CVD method, a contact hole 13 is formed in the interlevel insulating film 12 so as to reach the source region 10 and the drain region 11. After an aluminum (Al) film is deposited on the interlevel insulating film 12 by a sputtering method, the aluminum film is patterned by photolithography and etching technique, so that a source electrode 14 and a drain electrode 15 are formed. The source electrode 14 and the drain electrode 15 are connected to the source region 10 and the drain region 11 via the contact hole 13, respectively.

As a result, a TFT having a structure such as shown in FIG. 7D can be obtained. Then, preferably, the TFT is annealed in an atmosphere of hydrogen, whereby dangling bonds that exists in the grain boundaries in the polycrystalline silicon film 5 are terminated hydrogen. In this case, variations of field-effect mobility of the TFT across the substrate are suppressed to 4 to 5% or less.

EXAMPLE 8

Hereinafter, still another example of still another method for fabricating a TFT according to the present invention will be described with reference to FIGS. 8A to 8D.

An amorphous silicon layer 3 having a thickness of 20 nm is deposited on a glass substrate 1 (trade name: 7059, fabricated by Corning Inc.), on which an SiO$_2$ film (not shown) is attached as a buffer layer for preventing the impurities from diffusing from the glass, by a plasma CVD method and using silane (SiH$_4$) as a material gas. The temperature of the substrate 1 during deposition is set, for example, to 300° C. It is preferred that the thickness of the amorphous silicon layer 3 is in the range of 30 to 200 nm.

Next, by a plasma CVD method using silane (SiH$_4$) and silicon fluoride (SiF$_4$) as a material gas, a microcrystalline silicon layer 2 having a thickness of 5 nm is deposited. The temperature of the substrate 1 is set to 300° C. it is preferred that the thickness of the microcrystalline silicon layer 2 is in the range of 1 to 10 nm.

The temperature of the substrate 1 is decreased to 270° C., and then, by a plasma CVD method using silane as a material gas, an amorphous silicon layer 6 having a thickness of 20 nm is deposited on the microcrystalline silicon layer 2.

Figure 8A:
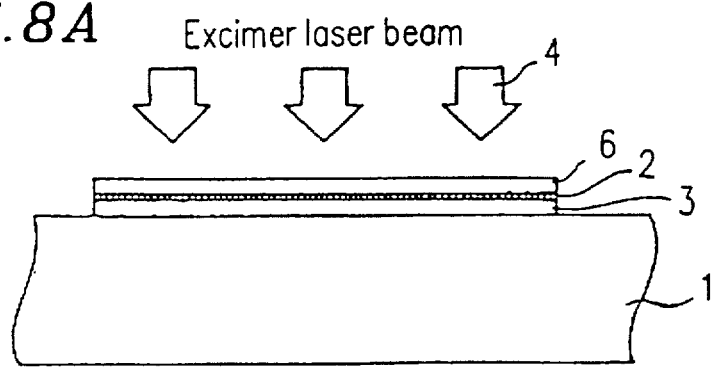
FIGS. 8A to 8D are sectional views showing still another example of a method for fabricating a thin-film transistor according to the present invention.

Next, by using a well-known photolithography and etching technique, the amorphous silicon layer 3 and the microcrystalline silicon layer 2 are processed, so that an island-shaped structure is formed. Although a single island-shaped structure is shown in FIG. 8A, in fact, a plurality of island-shaped structures are arranged on one substrate. Each island-shaped structure is in the size of, for example, 20 µm×20 µm.

Next, as schematically shown in FIG. 8A, a laser beam 4 is irradiated to the structure. The irradiation is performed under the same condition as that described in Example 1.

Figure 8B:
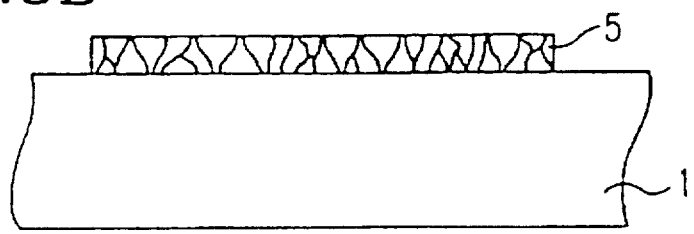

In the amorphous silicon layers 3 and 6 to which the laser beam 4 is irradiated, crystal grains grow upwards and downwards by using microcrystals in the microcrystalline silicon layer 2 as a seed. As a result, as schematically shown in FIG. 8B, a polycrystalline silicon film 5 in which crystal grains having a uniform size (grain diameter: approximately in the range of 200 to 300 nm) are distributed over the entire surface of the substrate 1 can be obtained.

Although the thickness of the amorphous silicon layer 3 is equal to that of the amorphous silicon layer 6 in this example, the thickness of the amorphous silicon layer 3 can be different from that of the amorphous silicon layer 6.

Figure 8C:
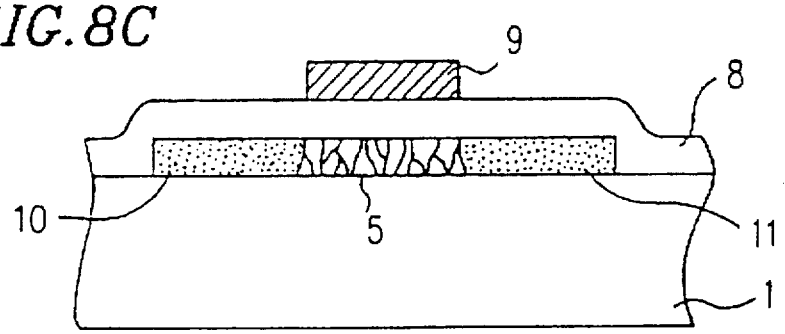

Next, as shown in FIG. 8C, a gate insulating film 8 made of $SiO_2$ is deposited over the entire surface of a substrate 1 by an AP-CVD method. After a chromium (Cr) film is deposited on the gate insulating film 8 by a sputtering method, the chromium film is patterned by photolithography and etching technique, so that a gate electrode 9 is formed.

Figure 8D:
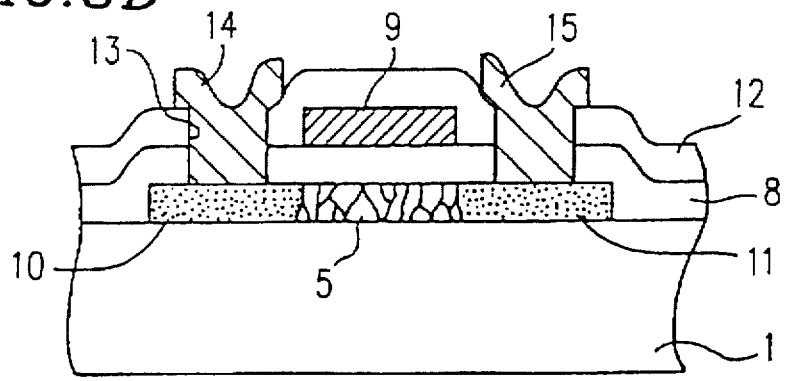
Figure 9:
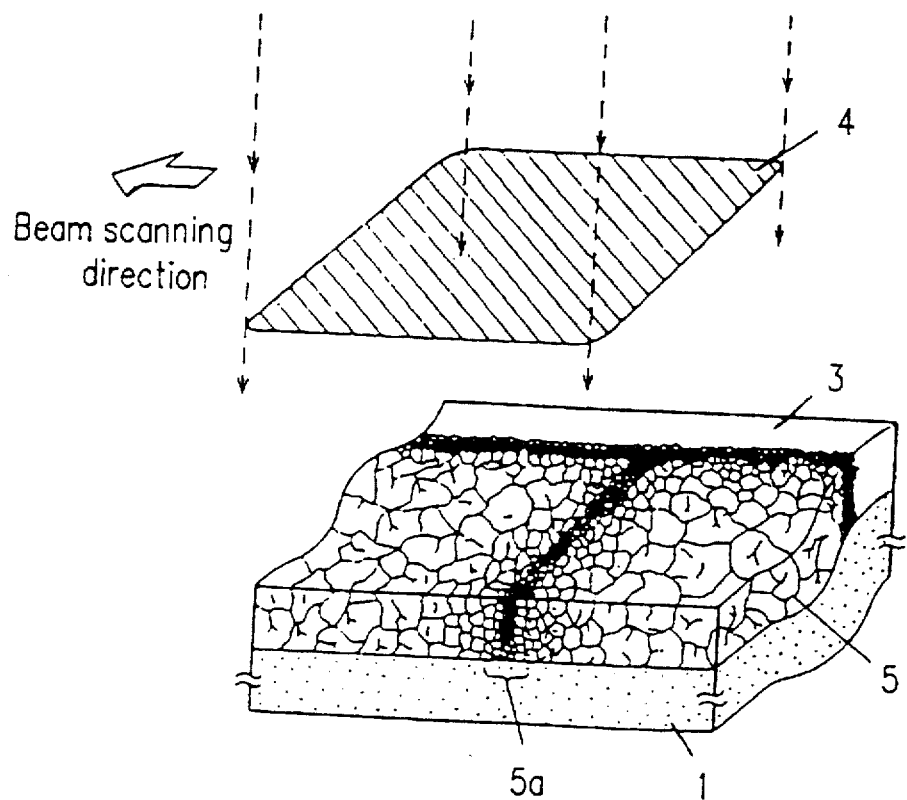
FIG. 9 is a schematic diagram showing a process of forming a polycrystalline silicon thin film by using excimer laser annealing.
Figure 10A:
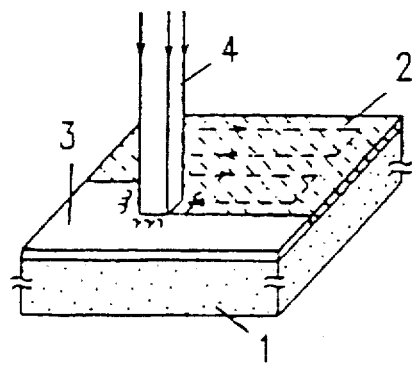
FIG. 10A is a diagram showing a first annealing according to a conventional example.
Figure 10B:
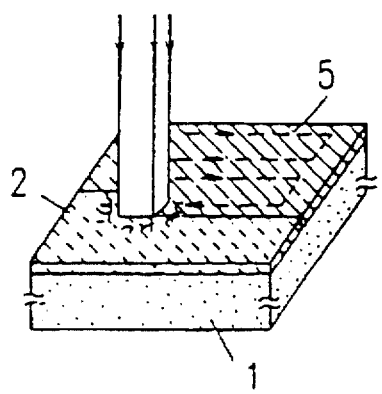
FIG. 10B is a diagram showing a second annealing.
Figure 10C:
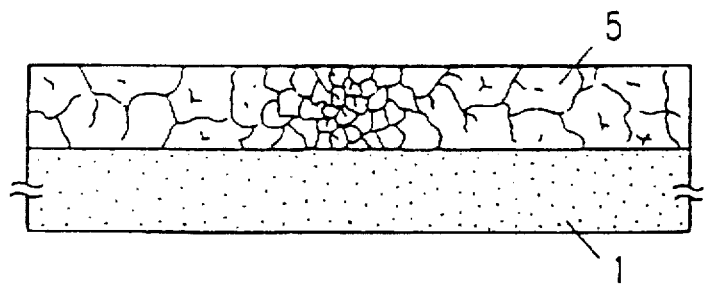
FIG. 10C is a partial sectional view showing a formed polycrystalline silicon thin film.
Figure 11A:
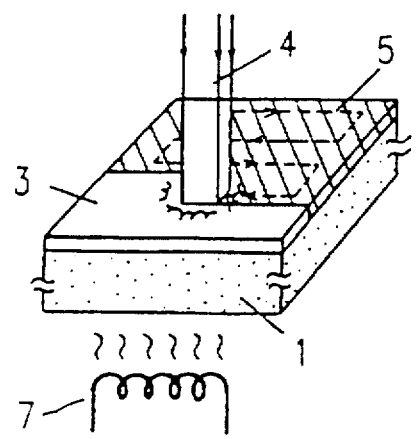
FIG. 11A is a diagram showing a first annealing according to a conventional example.
Figure 11B:
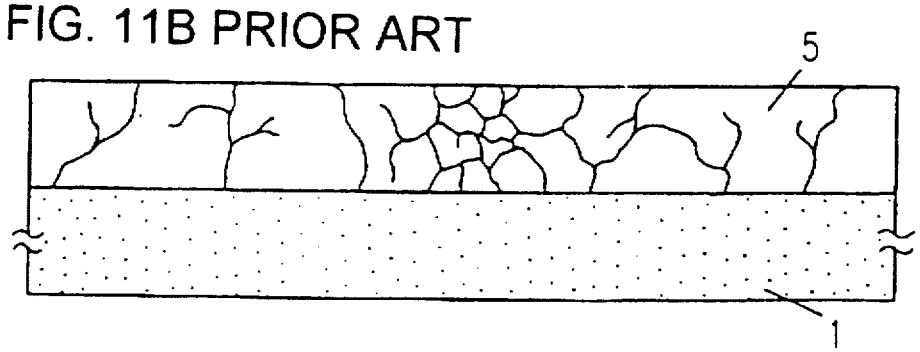
FIG. 11B is a partial sectional view showing a formed polycrystalline silicon thin-film.

A polycrystalline silicon film 5 is doped with impurity ions by using the gate electrode 9 as a mask, whereby a source region 10 and a drain region 11 are formed in self-alignment with the gate electrode 9, as shown in FIG. 8D.

Next, after depositing an interlevel insulating film 12 made of $SiO_2$ by an AP-CVD method, a contact hole 13 is formed in the interlevel insulating film 12 so as to reach the source region 10 and the drain region 11. After an aluminum (Al) film is deposited on the interlevel insulating film 12 by a sputtering method, the aluminum film is patterned by photolithography and etching technique, so that a source electrode 14 and a drain electrode 15 are formed. The source electrode 14 and the drain electrode 15 are connected to the source region 10 and the drain region 11 via the contact hole 13, respectively.

As a result, a TFT having a structure such as shown in FIG. 8D can be obtained. Then, preferably, the TFT is annealed in an atmosphere of hydrogen, whereby dangling bond that exists in the grain boundaries in the polycrystalline silicon film 5 are terminated with hydrogen. In this case, variations of field-effect mobility of the TFT across the substrate are suppressed to the range of 4 to 5% or less.

In Examples 6 to 8, silicon is used as a material of a thin film to be polycrystallized. However, in the present invention, other semiconductor materials such as germanium, silicon/germanium alloy, and the like can be used. Moreover, in Examples 6 to 8, a plasma CVD method and a thermal CVD method are used as a method for depositing an amorphous thin film. However, other methods such as an ECR-CVD method, a remote CVD method, a sputtering method, and the like, can be also employed for depositing a thin film.

Moreover, instead of a glass substrate 1 (trade name: 7059, fabricated by Corning), other insulating substrates such as other kinds of glass substrate, a quartz substrate, a sapphire substrate, and the like, can be used. Moreover, although an excimer laser is used as a laser, the same effect can be obtained by using other lasers such as a YAG laser.

As a material of the gate electrode 9, the source electrode 14, and the drain electrode 15, a silicide, a polycrystalline silicon doped with impurities at high concentration, a SiGe alloy, a transparent conductive material such as ITO, and the like, can be used, as well as a metal such as Cr, Al, Ta, Mo, and Ti.

Moreover, in order to improve the off-characteristics of a transistor, an LDD (Lightly Doped Drain) structure can be provided in a polycrystalline thin film. Moreover, it is possible that TFTs having different conductivity from each other are formed on one substrate, so that a CMOS circuit is constituted.

As described above, according to the present invention, a microcrystalline thin film containing crystal grains with an average diameters of approximately 20 nm or less is annealed by laser beam, so that a polycrystalline thin film containing crystal grains with an average diameters of approximately 20 nm or more is formed, whereby the uniformity of crystals across the substrate is improved. Moreover, in the case where a substrate is heated, a polycrystalline thin film of high quality can be obtained due to the expansion of the diameter of crystal grains and the reduction of the distortion of crystals. Moreover, non-uniformity of characteristics of a device fabricated by using a polycrystalline thin film across the substrate can be suppressed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming a polycrystalline semiconductor thin film comprising the steps of:

forming a semiconductor thin film partially containing microcrystals serving as crystal nuclei for polycrystallization on an insulating substrate, including:

forming an amorphous semiconductor layer, and annealing the amorphous semiconductor layer by a laser beam having an energy density near a threshold value of crystallization, thereby forming the microcrystal nuclei; and polycrystallizing the semiconductor thin film by laser annealing, wherein the semiconductor thin film, prior to being subjected to the polycrystallization process, contains a microcrystalline semiconductor layer containing the microcrystals and an amorphous semiconductor layer in contact with the microcrystalline semiconductor layer, the microcrystalline semiconductor layer lying beneath the entire amorphous layer.

2. A method according to claim 1, wherein the amorphous semiconductor layer is deposited on the microcrystalline semiconductor layer.

3. A method according to claim 1, wherein the microcrystalline semiconductor layer is formed by using a CVD method.

4. A method according to claim 1, wherein the laser annealing is conducted by using an excimer laser.

5. A method according to claim 1, wherein the laser annealing is conducted while the insulating substrate is maintained at a temperature in a range of approximately 200° to 600° C.

6. A method according to claim 1, wherein the semiconductor thin film is formed of a semiconductor material containing silicon or germanium as a main component.

7. A method according to claim 1, wherein the average diameter of crystal grains of microcrystals contained in the microcrystalline semiconductor layer is 20 nm or less.

8. A method according to claim 1, wherein the process of forming the microcrystalline semiconductor layer comprises the step of:

changing the amorphous semiconductor layer into the microcrystalline semiconductor layer.

9. A method for forming a polycrystalline semiconductor thin film comprising the steps of:

forming a semiconductor thin film partially containing microcrystals serving as crystal nuclei for polycrystallization on an insulating substrate, comprising the steps of;

forming an amorphous semiconductor layer, and annealing the amorphous semiconductor layer by a laser beam having an energy density near a threshold value of crystallization, thereby forming the microcrystal nuclei;

polycrystallizing the semiconductor thin film by laser annealing, wherein the semiconductor thin film prior to being subjected to the polycrystallization process comprises:

a microcrystalline semiconductor layer formed on the insulating substrate, which contains the microcrystals; and an amorphous semiconductor layer formed on the microcrystalline semiconductor layer so that the microcrystalline semiconductor layer is interposed between the insulating substrate and the amorphous semiconductor layer, and the microcrystalline semiconductor layer lies beneath the entire amorphous semiconductor layer.

10. A method for fabricating a thin-film transistor comprising the steps of:

forming a semiconductor thin film containing microcrystals serving as crystal nuclei for polycrystallization on an insulating substrate, comprising the steps of:

forming an amorphous semiconductor layer; and annealing the amorphous semiconductor layer by a laser beam having an energy density near a threshold value of crystallization, thereby forming the microcrystal nuclei;

polycrystallizing the semiconductor thin film by laser annealing, thereby forming a polycrystalline semiconductor thin film; and forming a source region a drain region, and a channel region in the polycrystalline semiconductor thin film, wherein the semiconductor thin film, prior to being subjected to the polycrystallization process, contains a microcrystalline semiconductor layer containing the microcrystals and an amorphous semiconductor layer in contact with the microcrystalline semiconductor layer, the microcrystalline semiconductor layer lying beneath the entire amorphous layer.

11. A method according to claim 10, wherein the average diameter of crystal grains of microcrystals contained in the microcrystalline semiconductor layer is 20 nm or less.

12. A method for fabricating a thin-film transistor comprising the steps of:

forming a semiconductor thin film containing microcrystals serving as crystal nuclei for polycrystallization on an insulating substrate, comprising the steps of forming an amorphous semiconductor layer, and annealing the amorphous semiconductor layer by a laser beam having an energy density near a threshold value of crystallization, thereby forming the microcrystal nuclei;

polycrystallizing the semiconductor thin film by laser annealing, thereby forming a polycrystalline semiconductor thin film; and forming a source region a drain region, and a channel region in the polycrystalline semiconductor thin film, wherein the semiconductor thin film prior to being subjected to the polycrystallization process comprises:

a microcrystalline semiconductor layer formed on the insulating substrate, which contains the microcrystals; and an amorphous semiconductor layer formed on the microcrystalline semiconductor layer so that the microcrystalline semiconductor layer is interposed between the insulating substrate and the amorphous semiconductor layer, and the microcrystalline semiconductor layer lies beneath the entire amorphous semiconductor layer.

\* \* \* \* \*

UNITED STATES PATENT AND TRADE MARK OFFICE
CERTIFICATE OF CORRECTION

PATENT NO. : 5,766,989
DATED : June 16, 1998
INVENTOR(S) : Maegawa et al.

It is certified that error appears in the above-identified patent and that said Letters Patent is hereby corrected as shown below:

On the cover page, item [56] Other Publications, "Crystallized mixed-phase silicon films for TFTs on glass substracts, Oct. 1993" should be -- Crystallized mixed-phase silicon films for TFTs on glass substracts, Sept. 1993--.

Signed and Sealed this

Fifth Day of January, 1999

*Attest:*

*Attesting Officer*

*Acting Commissioner of Patents and Trademarks*